United States Patent
Morioka et al.

(10) Patent No.: US 7,679,277 B2
(45) Date of Patent: Mar. 16, 2010

(54) LIGHT EMITTING DEVICE PROVIDED WITH SEMICONDUCTING PHOSPHOR CONFIGURED WITH FOUR FLUORESCENCES HAVING DIFFERENT EMISSION PEAK WAVELENGTHS

(75) Inventors: Tatsuya Morioka, Ikoma (JP); Osamu Kawasaki, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 508 days.

(21) Appl. No.: 11/606,901

(22) Filed: Dec. 1, 2006

(65) Prior Publication Data

US 2007/0138932 A1 Jun. 21, 2007

(30) Foreign Application Priority Data

Dec. 1, 2005 (JP) ............................. 2005-347996

(51) Int. Cl.
*H05B 33/00* (2006.01)
(52) U.S. Cl. .................. 313/486; 313/485; 313/487; 313/501; 313/512; 257/98; 257/99; 257/100
(58) Field of Classification Search ......... 313/498–512, 313/482–487; 257/88–100
See application file for complete search history.

(56) References Cited

U.S. PATENT DOCUMENTS

| | | | |
|---|---|---|---|
| 6,501,091 B1 * | 12/2002 | Bawendi et al. ............ | 257/100 |
| 6,608,439 B1 * | 8/2003 | Sokolik et al. ............. | 313/512 |
| 6,803,719 B1 * | 10/2004 | Miller et al. ............... | 257/100 |
| 7,102,152 B2 * | 9/2006 | Chua et al. ................. | 257/14 |
| 2003/0021982 A1 * | 1/2003 | Kotov ........................ | 428/323 |
| 2003/0042493 A1 * | 3/2003 | Kazakevich ................ | 257/98 |

FOREIGN PATENT DOCUMENTS

| | | |
|---|---|---|
| JP | 10-242513 | 9/1998 |
| JP | 2002-203989 | 7/2002 |
| JP | 2004-359842 | 12/2004 |
| JP | 2005-285800 | 10/2005 |
| JP | 2005-294288 | 10/2005 |
| WO | 03/032407 | 4/2003 |

* cited by examiner

*Primary Examiner*—Mariceli Santiago
(74) *Attorney, Agent, or Firm*—Harness, Dickey & Pierce, P.L.C.

(57) ABSTRACT

A light emitting device includes a light emitting element having an emission peak wavelength of 350 nm-420 nm and a phosphor absorbing light from this light emitting element and emitting fluorescence having a different emission peak wavelength. The phosphor is formed of a semiconductor material that allows the emission peak wavelength to be controlled by transition across the bandgap, and is configured with four or more fluorescences having different emission peak wavelengths. Thus, it is possible to provide a light emitting device which has a relatively simple structure to keep high theoretical efficiency limit and achieves good general color rendering index (Ra) and special color rendering index (R9).

10 Claims, 11 Drawing Sheets

LIGHT EMITTING DEVICE PROVIDED WITH SEMICONDUCTING PHOSPHOR CONFIGURED WITH FOUR FLUORESCENCES HAVING DIFFERENT EMISSION PEAK WAVELENGTHS

This nonprovisional application is based on Japanese Patent Application No. 2005-347996 filed with the Japan Patent Office on Dec. 1, 2005, the entire contents of which are hereby incorporated by reference.

BACKGROUND OF THE INVENTION

1. Field of the Invention

The present invention relates to a light emitting device including a combination of a light emitting element and a phosphor for use in general lighting.

2. Description of the Background Art

Conventionally, in the field of lighting, bulbs have mainly been used. However, in recent years, with significant improvement of optical characteristics of light emitting diodes or semiconductor lasers from the ultraviolet region to the blue region, white light emitting devices that use them as excitation light sources and are combined with phosphors have become commercially available. Some white light emitting devices are used in the field of lighting and are establishing themselves in the field of solid-state lighting.

An optical structure of such a white light emitting device has been developed which includes a light emitting element in the near-ultraviolet region of 350 nm-420 nm, which is combined with a phosphor absorbing excitation light therefrom and emitting light in red, green, blue to obtain white (see for example Japanese Patent Laying-Open No. 2002-203989). However, in such a configuration, it has been pointed out that the luminous flux of the white system is reduced in relation with the color balance.

Then, for example, WO03/032407 discloses a semiconductor light emitting device emitting white-based light with high luminous flux and high general color rendering index (Ra) by combining blue, yellow, green, red phosphors with a near-ultraviolet light emitting element, in place of the light emitting device disclosed in Japanese Patent Laying-Open No. 2002-203989. Furthermore, in WO03/032407, a novel yellow phosphor $(SrBaCaEu)_2SiO_4$ activated with rare-earth elements is disclosed as a yellow phosphor, which efficiently absorbs excitation light from the near-ultraviolet light emitting element.

However, in Example 1 of WO03/032407, the theoretical efficiency limit is only about 140[lm/W] and the general color rendering index (Ra) is only about 68. On the other hand, Example 3 of WO03/032407 which has a changed combination of phosphors achieves the theoretical efficiency limit of about 170[lm/W] and the general color rendering index (Ra) of about 92.

In this manner, when general phosphors activated with rare-earth elements are used, it is difficult to obtain the optimum combination of a desired emission wavelength by rare-earth elements serving as the luminescent center and a base material having an absorption band for absorbing excitation light enough, and it is difficult to select such an emission peak wavelength or an emission spectrum that optimizes the theoretical efficiency limit. Therefore, generally, in reality, various combinations of phosphors are tried to select the optimum combination of the theoretical efficiency limit and the general color rendering index (Ra). In the conventional structure including a yellow phosphor in addition to blue, green, red phosphors, the white luminous flux is improved but the theoretical efficiency limit has not been optimized enough.

Here, the theoretical efficiency limit refers to a luminous flux obtained when the internal quantum efficiency (defined as the ratio of photons of fluorescence/photons of excitation light) of a phosphor is 100% and all the excitation light is absorbed in the phosphor, where the phosphor is irradiated with excitation light of light intensity 1 W. For example, in Example 1 of WO03/032407, the luminous flux of about 140(lm) is obtained in the case as noted above. It is noted that the luminous efficiency (lm/W) in the actual light emitting device is obtained by multiplying the theoretical efficiency limit of the phosphor by the internal quantum efficiency of the phosphor, the absorptance of excitation light and the luminous efficiency of the light emitting element. Therefore, in order to improve the luminous efficiency of the light emitting device, the theoretical efficiency limit of the phosphor is preferably increased as much as possible.

In addition, the so-called general color rendering index (Ra) is preferably high which is an index in the use of a light emitting device as lighting to indicate a difference in vision of a color between an object viewed under sunlight (reference light D65) and an object viewed using a light source of a light emitting device. This general color rendering index (Ra) is generally 80-90 or higher for use in the general lighting, for example, such as fluorescent lamps. A value in this range is also requested in a semiconductor light emitting device using a light emitting device as a solid-state light source. Then, this general color rendering index (Ra) is also heavily dependent on the shape of emission spectrum.

Furthermore, a light emitting device having better characteristics may be obtained when the special color rendering index (R9) is higher which indicates how clean the red color is, when a red object is viewed. However, the documents that disclose prior arts do not describe those points.

SUMMARY OF THE INVENTION

The present invention is made to solve the aforementioned problems. An object of the present invention is to provide a light emitting device having a relatively simple configuration to keep a higher theoretical efficiency limit and being capable of achieving better general color rendering index (Ra) and special color rendering index (R9).

A light emitting device in accordance with the present invention includes: a light emitting element having an emission peak wavelength of 350 nm-420 nm; and a phosphor absorbing light from the light emitting element and emitting fluorescence having a different emission peak wavelength. The phosphor is formed of a semiconductor material that allows an emission peak wavelength to be controlled by transition across a bandgap and is configured with at least four fluorescences having different emission peak wavelengths.

In accordance with the light emitting device having a configuration of the present invention, the theoretical efficiency limit and the color rendering characteristic are improved. As a result, it is possible to realize a white light emitting device with improved luminance efficiency (lm/W).

In the light emitting device of the present invention, preferably, the phosphor is formed of a nano-size particle that produces a quantum effect, and an emission peak wavelength is controlled by transition across a quantum level formed by this effect.

Preferably, the light emitting element in the light emitting device of the present invention is a light emitting diode or a semiconductor laser including nitride semiconductor.

In the light emitting device of the present invention, preferably, the emission peak wavelengths of the plurality of phosphors are selected in a range of 430 nm-760 nm.

In the light emitting device of the present invention, preferably, the emission peak wavelengths of the plurality of phosphors are arranged at approximately regular intervals.

In the light emitting device of the present invention, each of the emission peak wavelengths of the plurality of phosphors is at least any one selected from the following (a)-(e):

(a) at least one of the emission peak wavelengths of a plurality of phosphors is selected in the range of 440 nm-480 nm;

(b) at least one of the emission peak wavelengths of a plurality of phosphors is selected in the range of 500 nm-540 nm;

(c) at least one of the emission peak wavelengths of a plurality of phosphors is selected in the range of 600 nm-680 nm;

(d) at least one of the emission peak wavelengths of a plurality of phosphors is selected in the range of 540 nm-560 nm; and (e) at least two of the emission peak wavelengths of a plurality of phosphors are selected in a range of 570 nm-610 nm and a range of 610 nm-650 nm.

Preferably, the light emitting device of the present invention includes: a light emitting element; a lead frame having the light emitting element mounted thereon; a wire electrically connecting the light emitting element and a power supply portion provided in the lead frame to each other; and a phosphor dispersed in a light transmitting resin and irradiated with excitation light emitted from the light emitting element. In the light emitting device having such a configuration, preferably, the light emitting element is covered with the light transmitting resin. In addition, preferably, an optical part is further included which is formed of a light transmitting resin which can control a light radiation state in which fluorescence emitted from the phosphor dispersed in the light transmitting resin is emitted in a space.

Preferably, the light emitting device of the present invention includes: a light emitting element; a light guide body to which excitation light emitted from the light emitting element is optically coupled; and an optical part at least formed of a light transmitting resin having the phosphor dispersed therein at a region other than a region where excitation light is optically coupled to the light guide body. In the light emitting device having such a configuration, preferably, the light guide body is formed of an optical fiber structure.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A light emitting device in accordance with the present invention basically includes a light emitting element having an emission peak wavelength of 350 nm-420 nm and a phosphor absorbing light from this light emission element to emit fluorescence having a different emission peak wavelength. The light emitting device of the present invention in such a structure is characterized in that the phosphor is formed by a semiconductor that allows an emission peak wavelength to be controlled by the transition across the bandgap and is formed by four or more fluorescences having different emission peak wavelengths. In accordance with such a light emitting device, the theoretical efficiency limit and the color rendering characteristic can be improved. As a result, a light emitting device with improved luminous efficiency can be realized.

In the light emitting device of the present invention, a semiconductor material that forms a phosphor is not specifically limited as long as the emission peak wavelength is controlled by the transition across the bandgap formed in the semiconductor material. For example, the semiconductor material may include $Zn_{1-x}Cd_xSe$, InGaN, and the like. The emission spectral characteristic of the phosphor using such a semiconductor material has very little wavelength dependency of the emission spectrum and a relatively narrow half width (about 40 nm or less), irrespective of the emission peak wavelength, because of the use of interband transition.

In addition, the light emitting device of the present invention is formed of four or more (preferably 4-5) fluorescences having different emission peak wavelengths. If the fluorescences that form emission peak wavelengths are three or less, the problem of the present invention is not solved because of the following reasons: (1) a high theoretical efficiency limit cannot be obtained; and (2) a high color rendering index cannot be obtained.

Figure 1:
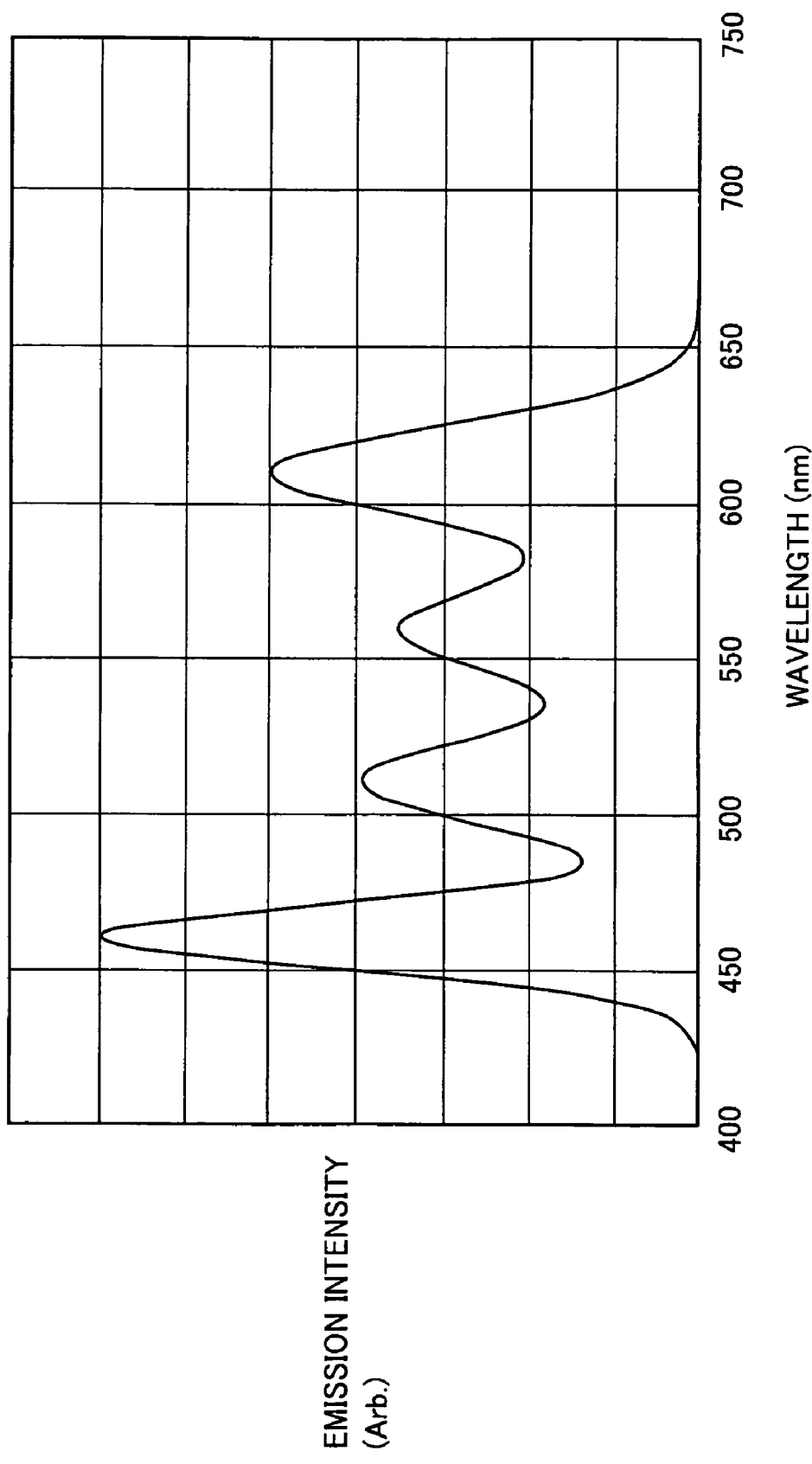
FIG. 1 is a diagram illustrating an exemplary emission spectrum of a phosphor suitably used in a light emitting device in accordance with the present invention.

Here, FIG. 1 shows an exemplary emission spectrum of a phosphor suitably used in the light emitting device of the present invention. It is noted that the emission spectrum of the excitation light source is not shown. In the present invention, the emission peak wavelengths of a plurality of phosphors are preferably selected in the range of 430 nm-760 nm. If the emission peak wavelength is less than 430 nm, the visibility tends to be very poor. If the emission peak wavelength is more than 760 nm, the visibility also tends to be very poor.

In the light emitting device of the present invention, each of the emission peak wavelengths of a plurality of phosphors is preferably in the following (a)-(d):

(a) at least one of the emission peak wavelengths of a plurality of phosphors is selected in the range of 440 nm-480 nm;

(b) at least one of the emission peak wavelengths of a plurality of phosphors is selected in the range of 500 nm-540 nm;

(c) at least one of the emission peak wavelengths of a plurality of phosphors is selected in the range of 600 nm-680 nm; and (d) at least one of the emission peak wavelengths of a plurality of phosphors is selected in the range of 540 nm-560 nm.

As described above, such phosphors are used that emit fluorescences, in particular, of the blue wavelength range of 440 nm-480 nm (that is, the emission peak wavelength in the aforementioned (a)), the green wavelength range of 500 nm-540 nm (that is, the emission peak wavelength in the aforementioned (b)), the red wavelength range of 600 nm-680 nm (that is, the emission peak wavelength in the aforementioned (c)), as light primaries, in the emission peak wavelengths formed by a plurality of fluorescences in the visible range of 430 nm-760 nm. In addition, such a phosphor is used that emits fluorescence of the 540 nm-560 nm wavelength range (that is, the emission peak wavelength in the aforementioned (d)) as an intermediate color, so that the theoretical efficiency limit can be improved and the Stokes loss determined by the wavelengths of excitation light and fluorescence can be reduced.

The reason why the theoretical efficiency limit is improved is assumed as follows. The luminous flux (lm) can be calculated by multiplying the spectral distribution of light power (mW) by the spectral luminous efficiency curve and integrating with each wavelength range, and the distribution of this spectral luminous efficiency curve has the maximum value in the vicinity of 550 nm range.

Here, even when the range outside 540 nm-560 nm (for example, 530 nm or 580 nm) is selected for the fourth phosphor having a different emission peak wavelength in addition to the phosphors emitting red, green and blue light, the theoretical efficiency limit of the phosphor can attain a relatively high value (for example 230(lm/W)). However, as described above, the higher theoretical efficiency limit can be achieved by using as the fourth phosphor the one having an emission peak value selected within the range of 540 nm-560 nm.

Furthermore, the Stokes loss is determined by the ratio between the excitation wavelength of excitation light and the emission wavelength of fluorescence (the red phosphor has a larger value), and as compared with the discrete spectra of three colors of red, green, blue, inclusion of a phosphor having an intermediate emission wavelength can reduce this loss.

In addition, when the emission wavelengths of the aforementioned (a)-(d) are combined, higher color rendering index (Ra) can be realized (for example, 80) depending on the emission spectral shape.

For example, in the example shown in FIG. 1, a phosphor having an emission peak wavelength of 460 nm is used as a phosphor having the emission peak wavelength of the above-noted (a), a phosphor having an emission peak wavelength of 510 nm is used as a phosphor having the emission peak wavelength of the above-noted (b), a phosphor having an emission peak wavelength of 610 nm is used as a phosphor having the emission peak wavelength of the above-noted (c), and a phosphor having an emission peak wavelength of 560 nm is used as a phosphor having the emission peak wavelength of the above-noted (d). Here, the dispersion ratio of each phosphor is adjusted such that white color (x=0.33, y=0.33) can be obtained on the CIE chromaticity diagram and the color rendering characteristic is good, for example, such that the emission intensity characteristic for each phosphor can be achieved as shown in FIG. 1. When each phosphor in the example shown in FIG. 1 is used, a white light emitting device having a theoretical efficiency limit of a phosphor of 246(lm/W) can be realized.

Figure 2A:
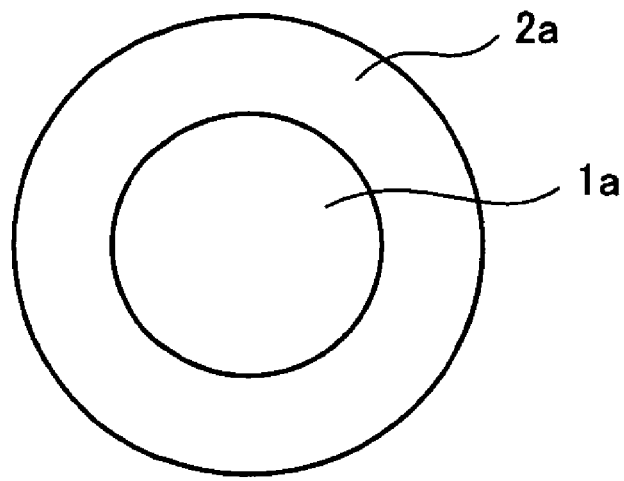
FIG. 2A is a diagram schematically showing a cross sectional structure of a phosphor.
Figure 2B:
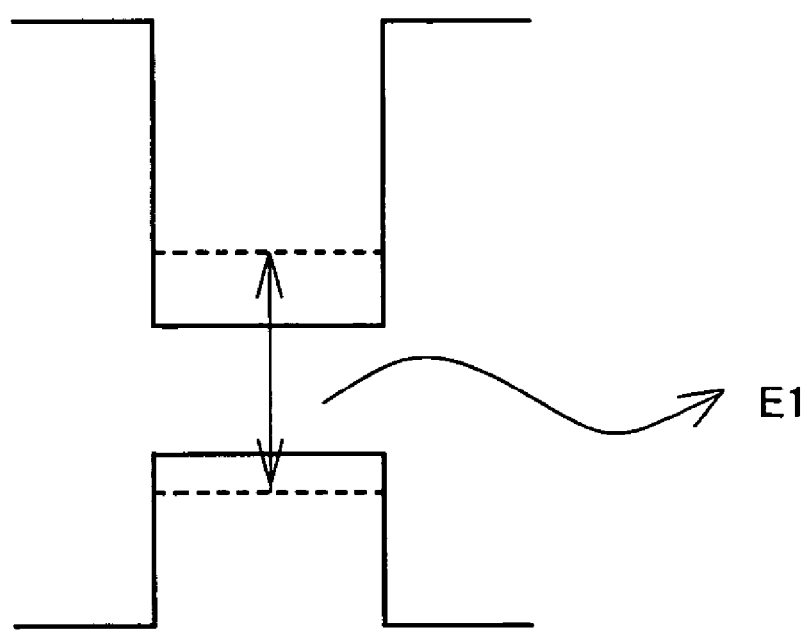
FIG. 2B is a diagram schematically showing a quantum level formed in a core and an emission state of fluorescence where a core size is different.
Figure 3A:
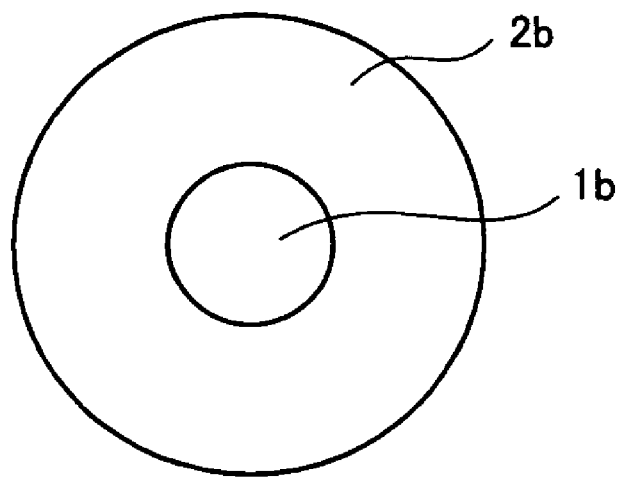
FIG. 3A is a diagram schematically showing a cross sectional structure of a phosphor.
Figure 3B:
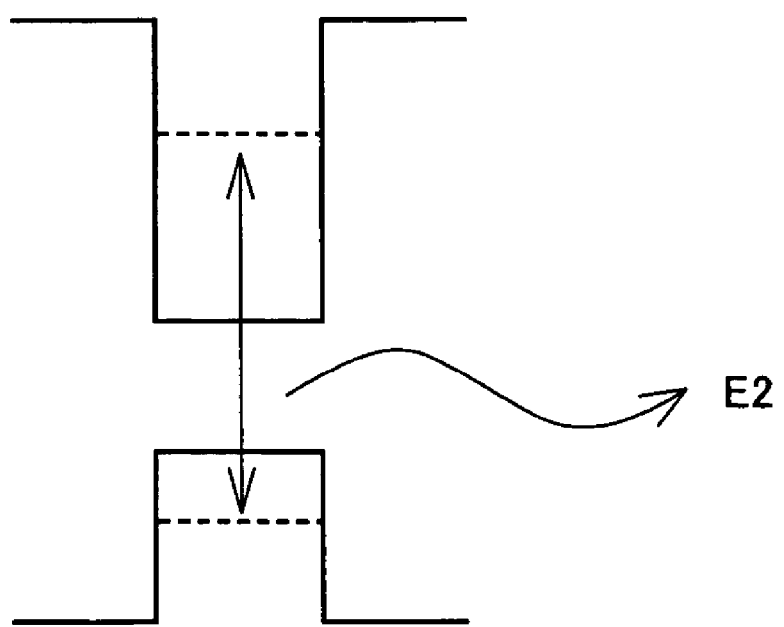
FIG. 3B is a diagram schematically showing a quantum level formed in a core and an emission state of fluorescence where a core size is different.

FIG. 2 and FIG. 3 are diagrams schematically showing a cross sectional structure of a phosphor (FIG. 2A and FIG. 3A) and a quantum level formed in a core and an emission state of fluorescence, where the core sizes are different (FIG. 2B and FIG. 3B). The phosphor in the present invention is formed of a semiconductor material that allows the emission peak wavelength to be controlled by the transition across the bandgap as described above and is preferably realized by a structure including a core $1a$, $1b$ and a shell $2a$, $2b$ which covers this core as shown in FIG. 2A and FIG. 3A. The diameter of core $1a$ shown in FIG. 2A is different from the diameter of core $1b$ shown in FIG. 3A. As shown in FIG. 2B and FIG. 3B which are the band structure diagrams of the phosphor, emission wavelengths E1, E2 are controlled by the difference of particle sizes of the cores.

In the example shown in FIG. 1, a phosphor formed of a core (ZnSe) having a particle size of 6 nm and a clad (ZnS) having a thickness of 1 μm which covers the core is illustrated as a phosphor with an emission peak wavelength 460 nm within the range of the aforementioned (a). Further, a phosphor formed of a core ($Zn_{0.62}Cd_{0.38}Se$) having a particle size of 5 nm and a clad (ZnS) having a thickness of 1 μm which covers the core is illustrated as a phosphor with an emission peak wavelength 510 nm within the range of the aforementioned (b). Further, a phosphor formed of a core ($Zn_{0.9}Cd_{0.1}Se$) having a particle size of 7 nm and a clad (ZnS) having a thickness of 1 μm which covers the core is illustrated as a phosphor with an emission peak wavelength 610 nm within the range of the aforementioned (c). In addition, a phosphor formed of a core ($Zn_{0.62}Cd_{0.38}Se$) having a particle size of 6.5 nm and a clad (ZnS) having a thickness of 1 μm which covers the core is illustrated as a phosphor with an emission peak wavelength 560 nm within the range of the aforementioned (d).

The phosphor in the present invention is preferably formed of a nano-size particle that brings about the quantum effect (nanoparticle phosphor), and the emission peak wavelength is controlled by the transition across the quantum level formed by this effect. The particle size of the core is controlled by using such a phosphor, so that the desired emission peak wavelength can continuously be changed by utilizing the quantum effect produced in the semiconductor material.

Furthermore, unlike the nanoparticle phosphor using the quantum effect produced in the semiconductor material as described above, the phosphor in the present invention may use a phosphor that allows the emission peak wavelength to be continuously changed by the bulk effect with the changed ratio of semiconductor mixed crystal that forms the core. For example, $Cd_xZn_{1-x}S_ySe_{1-y}$ ($0<x\leq1$, $0\leq y<1$) is used as mixed crystal of the core and ZnS is used as a clad, so that the emission peak wavelength can be controlled by changing x, y. Specifically, when x=0.3, y=0.5, a blue phosphor in the 480 nm range can be obtained.

Figure 4:
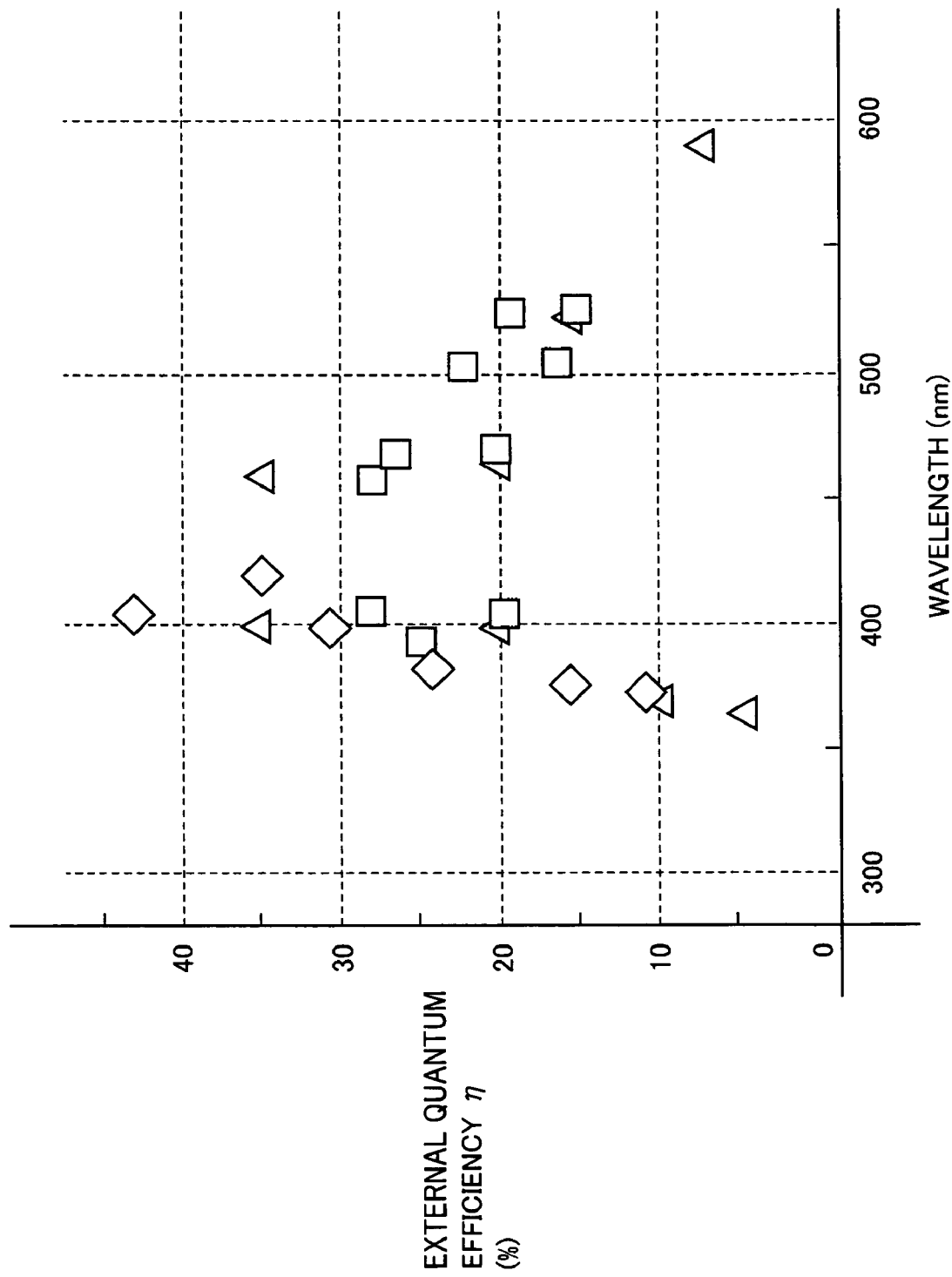
FIG. 4 is a graph showing a wavelength dependency of an external quantum efficiency of a light emitting element.

The light emitting element in the light emitting device of the present invention has an emission peak wavelength of 350 nm-420 nm (preferably 400 nm-420 nm). If the emission peak wavelength of the light emitting element is less than 350 nm, inconveniently, the external quantum efficiency is reduced and the luminous efficiency is reduced. On the other hand, if the emission peak wavelength of the light emitting element is more than 420 nm, inconveniently, the external quantum efficiency is reduced and the luminous efficiency is reduced. Here, FIG. 4 shows the wavelength dependency on the external quantum efficiency of the light emitting element. It is noted that the external quantum efficiency represents the number of photons that can be taken out with respect to the number of electrons injected in a light emitting element and is the amount proportional to the luminous efficiency of a light emitting element. As shown in FIG. 4, it can be understood that when a light emitting element of 405 nm range is used as an excitation light source, the external quantum efficiency of the light emitting element is highest, and the light emitting device using such a light emitting element can realize good luminous efficiency as a whole.

Such a light emitting element is not specifically limited as long as it has an emission peak wavelength in the above-noted range and may be a conventionally known one as appropriate.

A specific example of a light emitting diode that may be used as a light emitting element in the light emitting device of the present invention includes, for example, a GaN-base light emitting diode which has an element structure formed of a GaN buffer layer having a thickness of 4 μm, an n-type $Al_{0.1}Ga_{0.9}N$ lower cladding layer having a thickness of 1 μm, a non-doped $In_{0.15}Ga_{0.85}N$ active layer having a thickness of 0.02 μm, a thin, $Al_{0.15}Ga_{0.85}N$ anti-evaporation layer, a p-type $Al_{0.1}Ga_{0.9}N$ upper cladding layer having a thickness of 1 μm, and a p-type GaN cap layer having a thickness of 1 μm, on a GaN substrate, and including p-type and n-type electrode structures respectively formed on an element surface portion and a portion where the GaN buffer layer of 4 μm thick is partially exposed on the surface.

A specific example of a semiconductor laser that may be used as a light emitting element in the light emitting device of the present invention may include a broad area-type semiconductor laser having a width of 10 μm which has an element structure formed of a multiple quantum well active layer in which an n-GaN buffer layer, an n-type $Al_{0.1}Ga_{0.9}N$ layer having a layer thickness of 0.95 μm, an n-type GaN guide layer having a layer thickness of 100 nm, an $In_vGa_{1-v}N$ ($0\leq v\leq1$) barrier layer, an $In_wGa_{1-w}N$ ($0\leq w\leq1$) well layer are each repeated two cycles on a GaN substrate (here, the composition ratio and film thickness of InGaN are set such that the emission wavelength is 405 nm), followed by a $p-Al_{0.2}Ga_{0.8}N$ anti-evaporation layer having a layer thickness of 18 nm, a p-GaN light guide layer having a layer thickness of 100 nm, a p-type $Al_{0.1}Ga_{0.9}N$ cladding layer having a layer thickness of 0.5 μm, and a p-GaN contact layer having a thickness of 0.1 μm, with electrodes respectively formed on the both surfaces of the n type and the p type.

Figure 5:
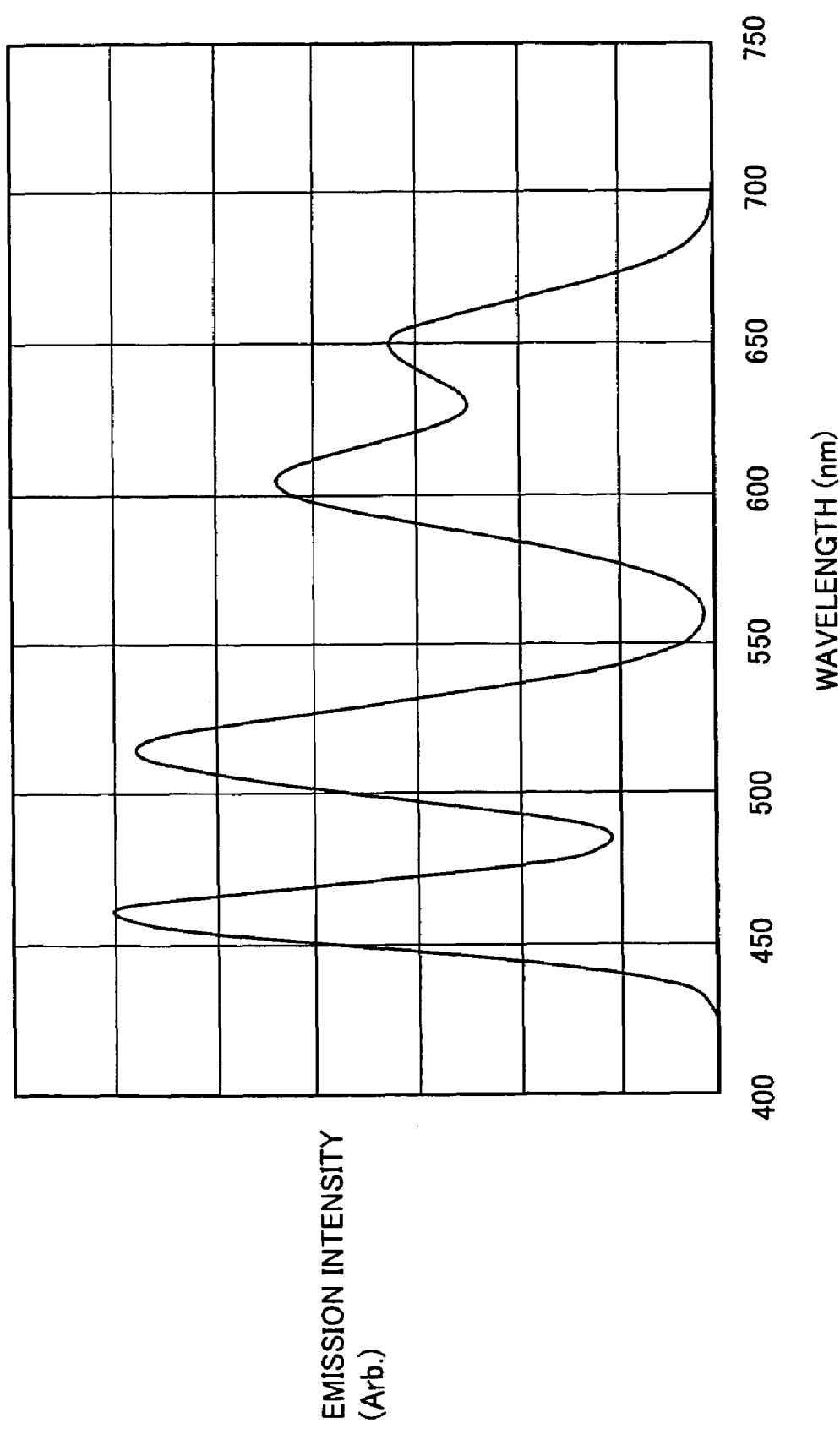
FIG. 5 is an emission spectrum showing an exemplary combination of emission peak wavelengths that are not arranged at approximately regular intervals.

In the present invention, the emission peak wavelengths of a plurality of phosphors are preferably arranged at approximately regular intervals, as in the example shown in FIG. 1. It is noted that "approximately regular intervals" means that the difference of intervals between emission peak wavelengths is about 40 nm-60 nm. Phosphors are combined to have a plurality of emission peak wavelengths arranged at approximately regular intervals thereby to enhance the color rendering characteristic in the state of a good theoretical efficiency limit as compared with the use of phosphors having a plurality of emission peak wavelengths not arranged at approximately regular intervals. Here, FIG. 5 shows that emission peak wavelengths of four phosphors of 460 nm, 515 nm, 600 nm, and 650 nm are not arranged at regular intervals. When the combination of phosphors as shown in FIG. 5 is used, a relatively high theoretical efficiency limit can be obtained (for example 190(lm/W)), but the color rendering index (Ra) may be reduced (for example about 52). It is noted that although FIG. 5 shows a combination of emission peak wavelengths not arranged at approximately regular intervals, a combination of emission peak wavelengths not arranged at approximately regular intervals, other than the example shown in FIG. 5, also exhibits the similar tendency.

Figure 6:
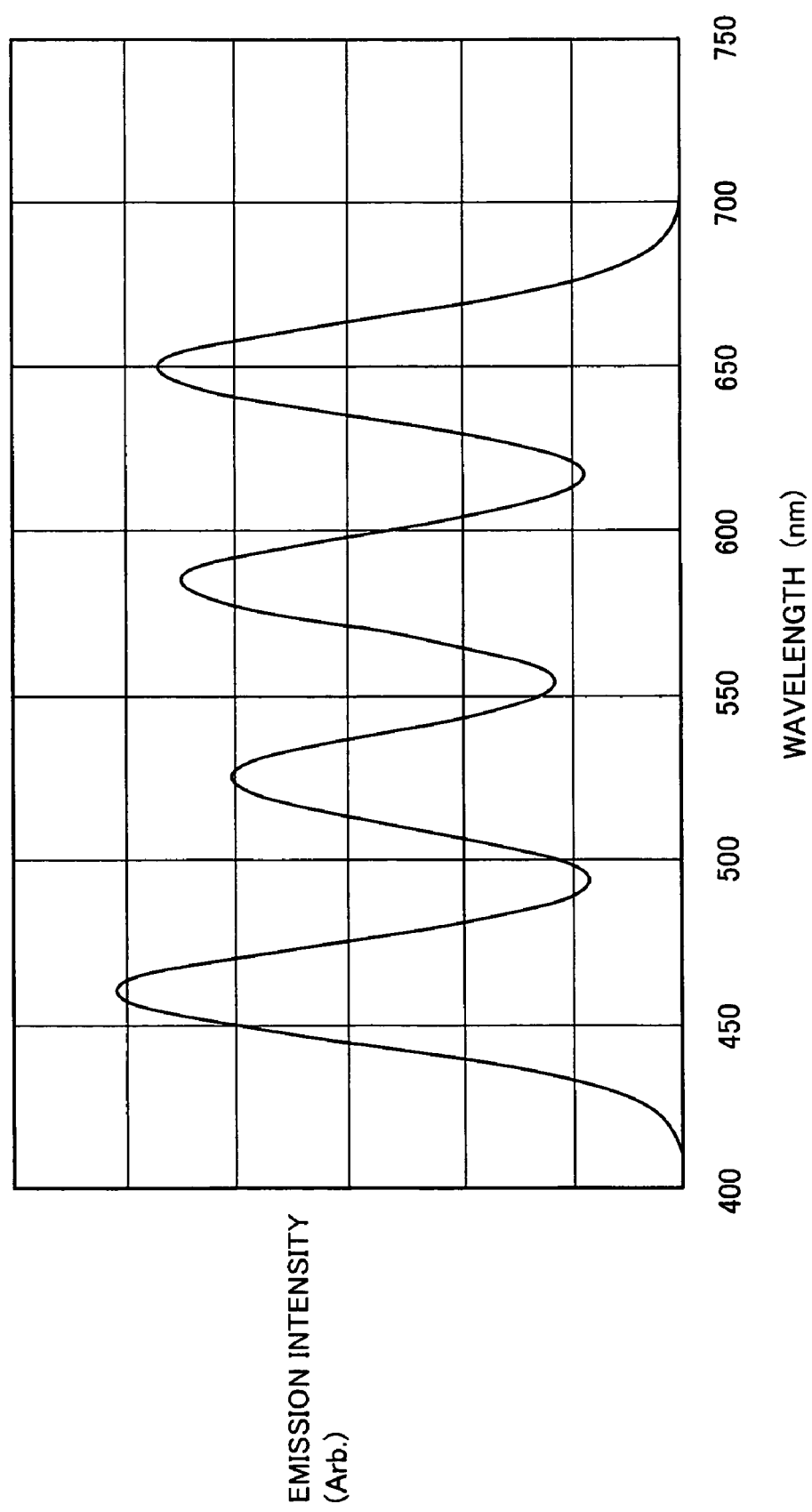
FIG. 6 is a diagram showing another example of an emission spectrum of a phosphor suitably used in the light emitting device in accordance with the present invention.

The light emitting device of the present invention may include, as a preferable example, the case (e) where at least two of emission peak wavelengths of a plurality of phosphors are selected in the range of 570 nm-610 nm and the range of 610 nm-650 nm, in place of the case where at least one of emission peak wavelengths of a plurality of phosphors is selected in the range of 540 nm-560 nm (the emission peak wavelength in the aforementioned (d)). FIG. 6 shows another example of an emission spectrum of a phosphor suitably used in the light emitting device of the present invention. It is noted that FIG. 6 does not show the emission spectrum of the excitation light source.

FIG. 6 shows an example formed of four phosphors having different emission peak wavelengths (460 nm, 525 nm, 585 nm, and 650 nm) where the emission peak wavelengths of at least two phosphors are selected in the range of 570 nm-610 nm and the range of 610 nm-650 nm. In other words, in the example shown in FIG. 6, a phosphor having an emission peak wavelength of 460 nm is used as a phosphor having the emission peak wavelength in the aforementioned (a), a phosphor having an emission peak wavelength of 525 nm is used as a phosphor having the emission peak wavelength in the aforementioned (b), and a phosphor having an emission peak wavelength of 650 nm is used as a phosphor having the emission peak wavelength in the aforementioned (c). In addition, a phosphor having an emission peak wavelength of 585 nm is used as a phosphor having the emission peak wavelength in the range of 570 nm-610 nm, and a phosphor having an emission peak wavelength of 650 nm that is the emission peak wavelength in the aforementioned (c) is used as a phosphor having the emission peak wavelength in the range of 610 nm-650 nm. It is noted that also in the example shown in FIG. 6, the dispersion ratio of each phosphor is adjusted such that, for example, white (x=0.33, y=0.33) can be obtained on the CIE chromaticity diagram and in addition the emission intensity of each phosphor can be obtained as shown in FIG. 5 to achieve good color rendering characteristic.

As a result of a detailed study by the inventors, in the phosphor formed of a semiconductor material including a nanoparticle with the full width at half maximum of the emission spectrum of up to about 40 nm, the emission peak wavelengths of at least two phosphors are selected in the red region and the orange region, that is, the emission peak wavelengths are set between 570 nm and 610 nm and between 610 nm and 650 nm, and these two emission intensities are adjusted as appropriate so that a high theoretical efficiency limit of the phosphor is maintained (in the case of the example shown in FIG. 6, 220(lm/W)) while the color rendering index (Ra) attains 90, which is extremely high. The special color rendering index (R9) is set as high as 90 where an object of a red color can be seen beautiful. These values can be adequately applied not only to general lighting but also to medical lighting with emphasis on the red tone as in a surgical operation or museum lighting.

It is noted that also in the example shown in FIG. 6, with a phosphor using a semiconductor material that allows the emission peak wavelength to be controlled by the transition across the bandgap formed in the semiconductor, a desired emission peak wavelength of phosphor can be easily selected.

Figure 7:
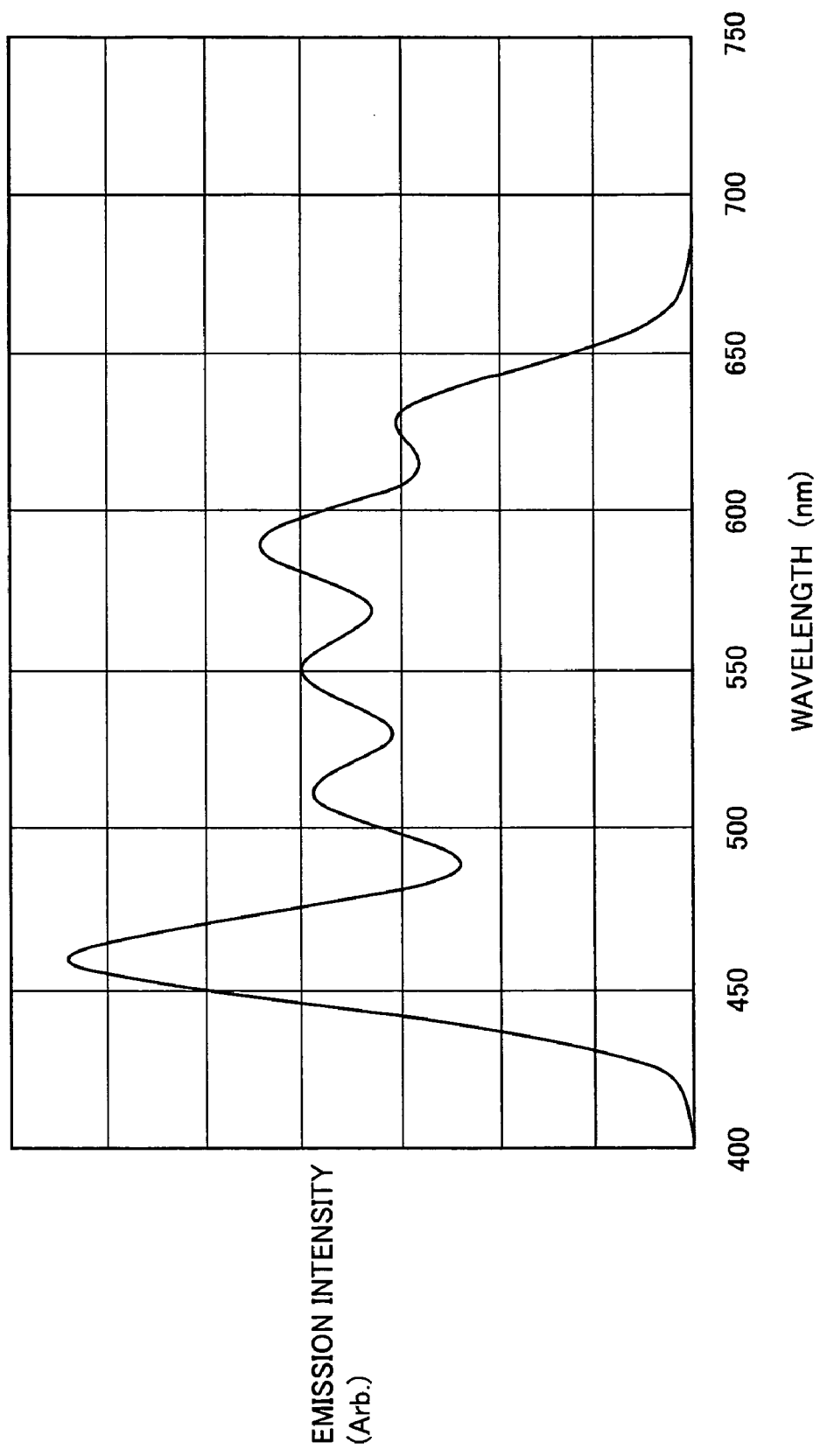
FIG. 7 is a diagram showing another example of an emission spectrum of a phosphor suitably used in the light emitting device in accordance with the present invention.

FIG. 7 shows another example of an emission spectrum of a phosphor suitably used in the light emitting device of the present invention. It is noted that FIG. 7 does not show the emission spectrum of the excitation light source. In the light emitting device of the present invention, it is preferable that phosphors are selectively used to have at least five kinds of emission peak wavelengths as shown in FIG. 7, rather than the case where phosphors are selectively used to have four kinds of emission peak wavelengths as described above.

Table 1 shows the relation between the theoretical efficiency limit and the color rendering index with respect to the number of phosphors and emission peak wavelengths as found by the inventors.

TABLE 1

| number of phosphors | emission peak wavelength | | | theoretical efficiency limit (lm/W) | color rendering index (Ra) |
|---|---|---|---|---|---|
| | blue, green | 540~550 nm | 570~610 nm 610~650 nm | | |
| 4 | ○ | None | ○ | 245 | 80 |
| | ○ | ○ | None | 220 | 90 |
| 5 | ○ | ○ | ○ | 245 | 89 |

As can be understood from Table 1, a light emitting device superior in luminous efficiency can be realized by selectively using phosphors to have at least five kinds of emission peak wavelengths in such a manner as to include all the emission peak wavelengths in the aforementioned (a)-(e) thereby including both of the emission peak wavelength in the aforementioned (d) that may improve the theoretical efficiency limit and the emission peak wavelength in the aforementioned (e) that may improve the color rendering index at the same time.

FIG. 7 shows an example in which a phosphor having an emission peak wavelength of 460 nm is used as a phosphor having the emission peak wavelength in the aforementioned (a), a phosphor having an emission peak wavelength of 510 nm is used as a phosphor having the emission peak wavelength in the aforementioned (b), a phosphor having an emission peak wavelength of 630 nm is used as a phosphor having the emission peak wavelength in the aforementioned (c), a phosphor having an emission peak wavelength of 580 nm is used as a phosphor having the emission peak wavelength in the aforementioned (d), and a phosphor having an emission peak wavelength of 550 nm and a phosphor having an emission peak wavelength of 630 nm (a phosphor having the emission peak wavelength in the aforementioned (c)) are used as phosphors having the emission peak wavelengths in the aforementioned (e).

In the example shown in FIG. 7, a phosphor formed of a core (ZnSe) having a particle size of 6 nm and a clad (ZnS) having a thickness of 1 μm which covers the core is illustrated as a phosphor having an emission peak wavelength of 460 nm within the range of the aforementioned (a). A phosphor formed of a core ($Zn_{0.63}Cd_{0.38}Se$) having a particle size of 5 nm and a clad (ZnS) having a thickness of 1 μm which covers the core is illustrated as a phosphor having an emission peak wavelength of 510 nm within the range of the aforementioned (b). A phosphor formed of a core ($Zn_{0.9}Cd_{0.1}Se$) having a particle size of 7.5 nm and a clad (ZnS) having a thickness of 1 μm which covers the core is illustrated as a phosphor having an emission peak wavelength of 630 nm within the range of 610 nm-650 nm of the aforementioned (c) and (e). A phosphor formed of a core ($Zn_{0.62}Cd_{0.38}Se$) having a particle size of 7 nm and a clad (ZnS) having a thickness of 1 μm which covers the core is illustrated as a phosphor having an emission peak wavelength of 550 nm within the range of the aforementioned (d). In addition, a phosphor formed of a core ($Zn_{0.9}Cd_{0.1}Se$) having a particle size of 5 μm and a clad (ZnS) having a thickness of 1 μm which covers the core is illustrated as a phosphor having an emission peak wavelength of 580 nm within the range of 570 nm-610 nm of the aforementioned (e).

It is noted that five or more phosphors may be embraced in the scope of the present invention since the emission spectral distribution can be broadened while a desired emission peak wavelength is selected, thereby achieving the similar effect of keeping high theoretical efficiency limit and good color rendering index.

Figure 8:
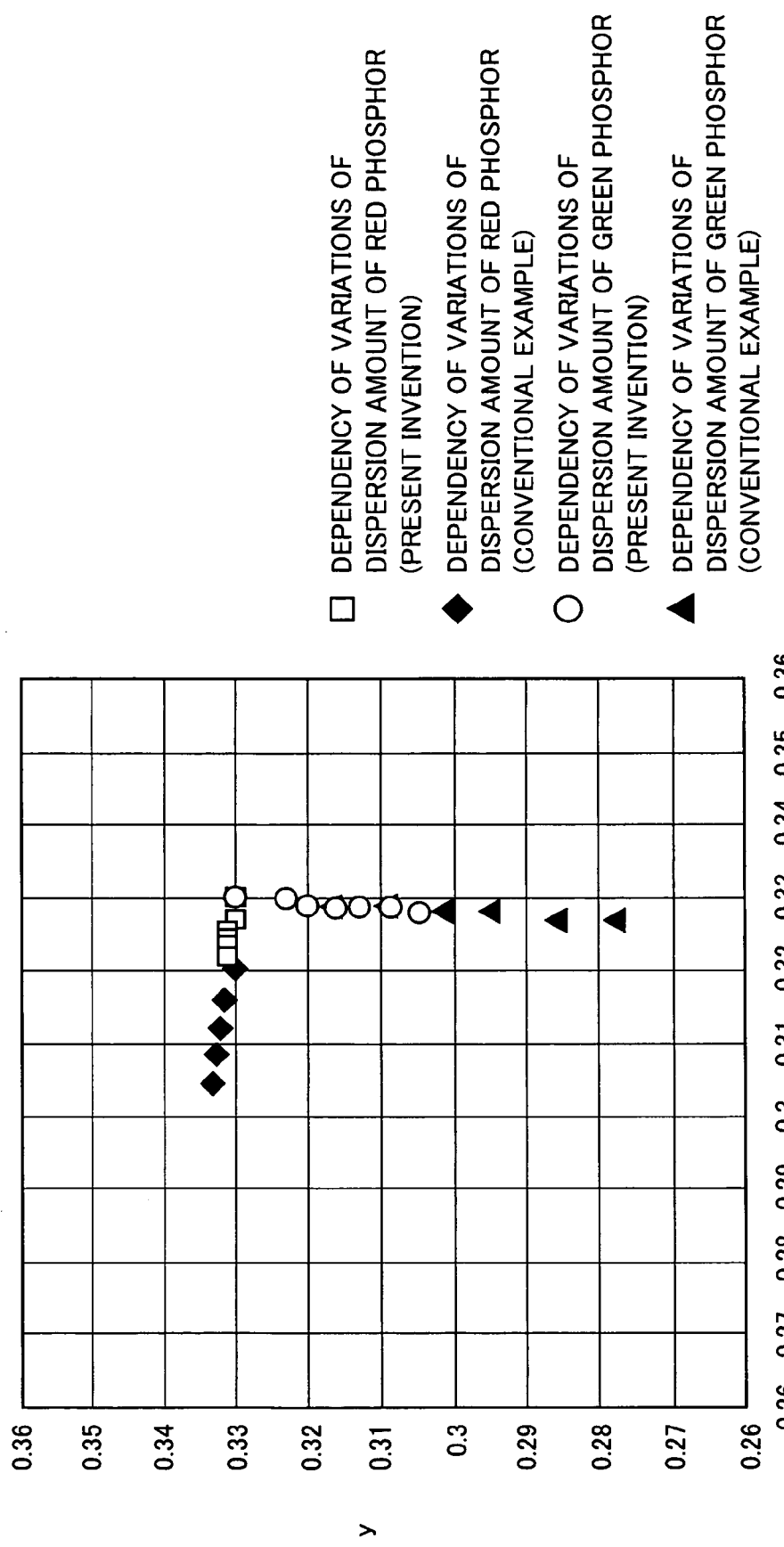
FIG. 8 is a diagram showing a deviation from white (x=0.33, y=0.33) with respect to variations in the amount of dispersion of phosphors on a CIE chromaticity diagram in the cases where conventional red, green, blue phosphors are used and where the configuration of phosphors of the present invention is used.

FIG. 8 shows a deviation from white (x=0.33, y=0.33) with respect to the amount of dispersion of phosphors on a CIE chromaticity diagram when conventional red, green, blue phosphors are used and when the configuration of phosphors of the present invention is used. In FIG. 8, the effect on white is estimated in the case where the mixture amount of phosphor of one color is varied when phosphors are mixed to obtain white (x=0.33, y=0.33) on the CIE chromaticity diagram using the configuration formed of a plurality of emission spectrum wavelengths (460 nm, 510 nm, 550 nm, 580 nm, 630 nm), as used in the present invention, and the configuration formed of emission spectrum wavelengths of red (630 nm), green (550 nm), blue (460 nm).

In FIG. 8, square rectangles and black rhombuses show the case where the mixture amount of red (630 nm) phosphor is varied, and white circles and black triangles show the case where the mixture amount of green (510 nm) phosphor is varied. As can be understood from FIG. 8, the configuration of the present invention can reduce the deviation from white as being set for variations of the mixture amount of phosphors and can also prevent variations of a color due to manufacturing variations.

Although the specific structure of the light emitting device of the present invention is not specifically limited, a suitable specific example will be described below.

Figure 9:
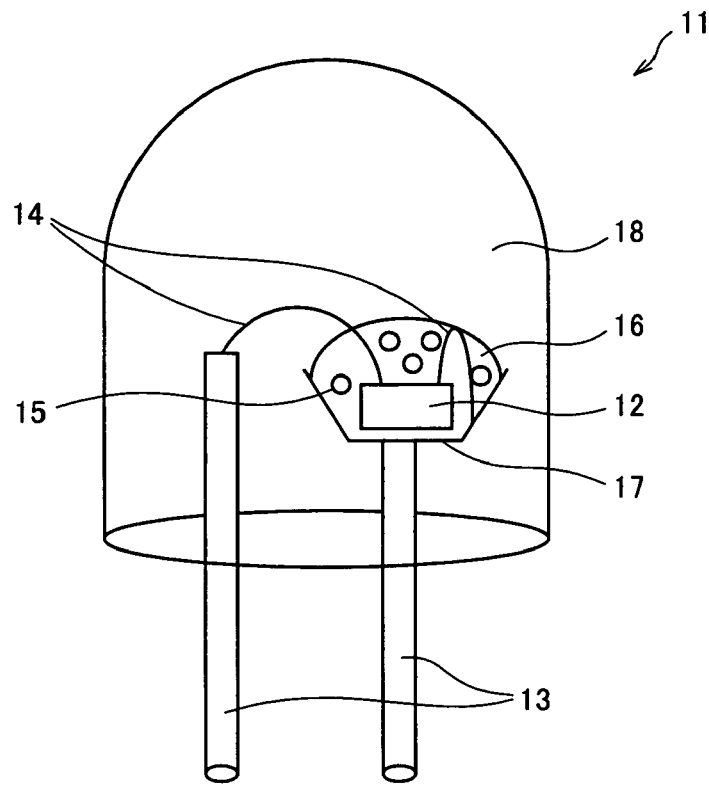
FIG. 9 is a diagram schematically showing a light emitting device 11 in a first preferable example of the present invention.

FIG. 9 is a diagram schematically showing a light emitting device 11 of a first preferable example of the present invention. Light emitting device 11 shown in FIG. 9 includes a light emitting element 12, a lead frame 13 having light emitting element 12 mounted thereon, a wire 14 electrically connecting light emitting element 12 and a power supply portion provided in lead frame 13 to each other, and phosphors 15 dispersed in a light transmitting resin 16 irradiated with excitation light emitted from light emitting element 12. In the example shown in FIG. 9, for example, a GaN-base light emitting diode (emission peak wavelength: 405 nm) of 5 mm square is used as light emitting element 12. Light emitting element 12 is mounted inside a conductive, concave cup 17 electrically connected to one end of lead frame 13, using silver paste. Gold wire 14 is provided on each of an electrode pad (not shown) provided on the upper surface of light emitting element 12 and two pairs of lead frames.

Four or more kinds that can realize the combination of emission peak wavelengths as described above can preferably be used as phosphors 15. Light transmitting resin 16 having phosphors 15 dispersed may employ a conventionally known one as appropriate without any particular limitation and may include, for example, a silica-based resin or the like.

In light emitting device 11 in the example shown in FIG. 9, light emitting element 12 is also arranged in the light transmitting resin having phosphors 15 dispersed therein. The arrangement of light emitting element 12 in the light transmitting resin in this manner advantageously results in a cannon ball-shaped light emitting device having good luminous efficiency.

In addition, the light emitting device of the present invention preferably includes a cannon ball-shaped optical part 18 formed to cover the above-noted structure excluding a part of lead frame 13, as in the example shown in FIG. 9. Optical part 18 is formed of a light transmitting resin as illustrated above, and such optical part 18 makes it possible to control a light radiation state in which fluorescence emitted from phosphors 15 dispersed in light transmitting resin 16 is emitted in the space.

Figure 10:
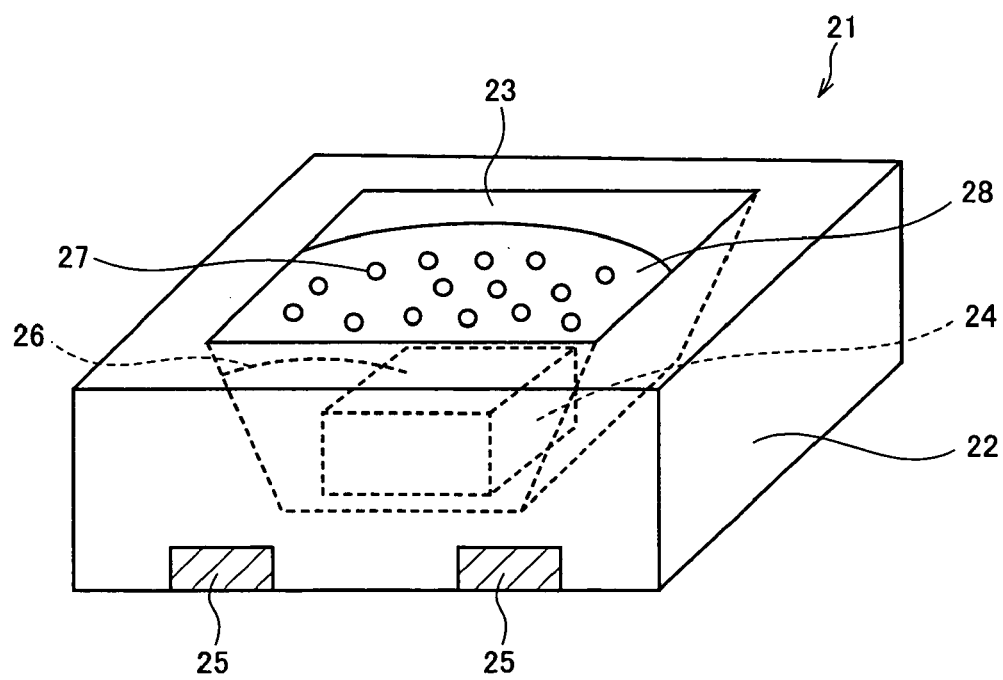
FIG. 10 is a diagram schematically showing a light emitting device 21 in a second preferable example of the present invention.

FIG. 10 is a diagram schematically showing a light emitting device 21 in a second preferable example of the present invention. In light emitting device 21 in the example shown in FIG. 10, a light emitting element 24 is mounted in a concave depression 23 of a ceramic material 22 having a thickness of about 5 mm, using sliver paste. In the example shown in FIG. 10, similar to the example as described above with reference to FIG. 9, for example, a GaN-base light emitting diode (emission peak wavelength: 405 nm) of 5 mm square can be used as light emitting element 23. A gold wire 26 is provided from an electrode pad portion (not shown) of light emitting element 23 to a power supply terminal 25 formed in ceramic material 22 to be exposed outside, and this power supply terminal 25 supplies power.

In the device in the example shown in FIG. 10, an optical film (not shown) having high reflection characteristic that can reflect excitation light emitted from light emitting element 24 or fluorescence emitted from phosphors 27 is preferably formed on the surface of depression 23 of ceramic material 22. The formation of such an optical film can improve the efficiency of using excitation light for phosphor 27 or the efficiency of taking out fluorescence to the outside of the light emitting device. The optical film is suitably realized, for example, by a metal film of aluminum.

Furthermore, a light transmitting resin 28 having phosphors 27 dispersed therein is filled in depression 23 in the light emitting device 21 in the example shown in FIG. 10. Similarly to light emitting device 11 in the example shown in FIG. 9, also in light emitting device 21 in the example shown in FIG. 10, light emitting element 24 is realized in such a manner that it is covered with light transmitting resin 28 having phosphors 27 dispersed therein.

Four or more kinds that can realize the combination of emission peak wavelengths as described above can preferably used as phosphors 27. Light transmitting resin 28 having phosphors 27 dispersed therein may employ a conventionally known one as appropriate without any particular limitation.

Because of the configuration as described above, it is possible to realize light emitting device 21 having good luminous efficiency with respect to supply power and also having very good color rendering characteristic. It is noted that generally, the heat generated by Strokes loss in a phosphor is likely to reduce an optical output of the light emitting element or reduce reliability. However, in the present invention as described above, as compared with the conventional one, this Strokes loss can be reduced. Therefore, the light emitting device of the present invention is especially suitable as a thin compact light emitting device in which the heat dissipation characteristic of the package is not so good.

Figure 11:
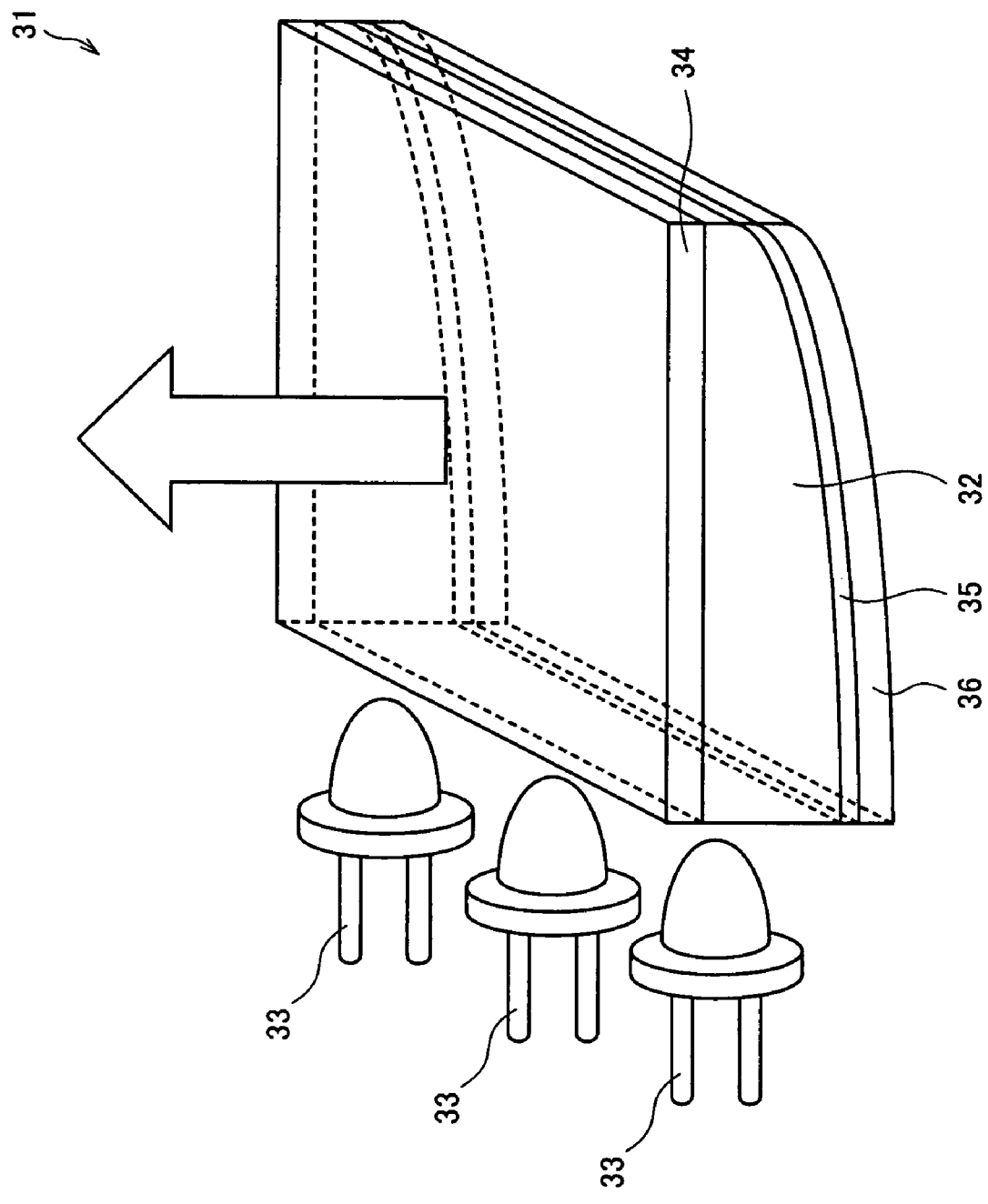
FIG. 11 is a diagram schematically showing a light emitting device 31 in a third preferable example of the present invention.

FIG. 11 is a diagram schematically showing a light emitting device 31 in a third preferable example of the present invention. Light emitting device 31 in the example shown in FIG. 11 includes, for example, a light transmitting resin plate 32 made of an acrylic material having a convex shape formed on the back surface side to transmit excitation light and emit the transmitted excitation light to the front surface side (the direction shown by a white outline arrow in the figure) and a light emitting element 33 applying excitation light at one end surface of light transmitting resin plate 32. In light emitting device 31 in the example shown in FIG. 11, light transmitting resin plate 34 having phosphors (not shown) dispersed therein is stacked on the front surface side of light transmitting resin plate 32. On the other hand, an optical film 36 is formed on the back surface side of light transmitting resin plate 32 with a diffusion portion 35 interposed therebetween.

Similar to light emitting elements 12, 24 in light emitting devices 11, 21 shown in FIG. 9 and FIG. 10, for example, a GaN-base light emitting diode (emission peak wavelength: 405 nm) of 5 mm square can be used as light emitting element 33 in light emitting device 31 in the example shown in FIG. 11. Light emitting device 31 shown in FIG. 11 differs from light emitting devices 11, 21 shown in FIG. 9 and FIG. 10, in that the light emitting element is not covered with a light transmitting resin having phosphors dispersed therein and a plurality of light emitting elements are provided outside. Therefore, in light emitting device 31 shown in FIG. 11, excitation light from light emitting element 33 is emitted to the outside.

Four or more kinds that can realize the combination of emission peak wavelengths as described above can also preferably be used as phosphors in the example shown in FIG. 11. Light transmitting resin plate 34 having these phosphors dispersed therein can employ a conventionally known one as appropriate without any particular limitation and may include, for example, a plate formed of a silica-based resin or the like.

Diffusion portion 35 formed on the back surface side of light transmitting resin plate 32 may be, for example, the one having polymer particles dispersed therein that allows excitation light propagating in light transmitting resin plate 32 to be evenly dispersed to the front surface side.

Optical film 36 may prevent scattering of excitation light to the downward direction of light transmitting resin plate 32 (that is, the direction opposite to the direction shown by the white outline arrow in the figure) and is formed of, for example, a metal film made of aluminum.

It is noted that in light emitting device 31 in the example shown in FIG. 11, an optical film having the total reflection characteristic is preferably formed of a metal film made of aluminum (not shown) on that side surface portion of light transmitting resin plate 32 at which light emitting element 33 is not arranged, and the like. In this manner, an optical film is formed to cover the portion of light transmitting resin film 32 other than the portion where excitation light from light emitting element 33 enters, thereby preventing the excitation light propagating in light transmitting resin plate 32 from being emitted outside from an undesired part.

According to light emitting device 31 having the configuration described above in the example shown in FIG. 11, excitation light emitted from light emitting element 33 propagates and scatters in light transmitting resin plate 32 to attain a uniform optical intensity distribution and irradiates light transmitting resin plate 34 having phosphors dispersed therein, so that fluorescence from the phosphors in light transmitting resin plate 34 is emitted to the outside. Also in this form, it is possible to realize a flat-type light emitting device 31 having good luminous efficiency with respect to supply power and having very good color rendering characteristic. A flat-type white light emitting device having a structure as shown in FIG. 11 may be applied, for example, to a liquid crystal backlight or the like.

Figure 12:
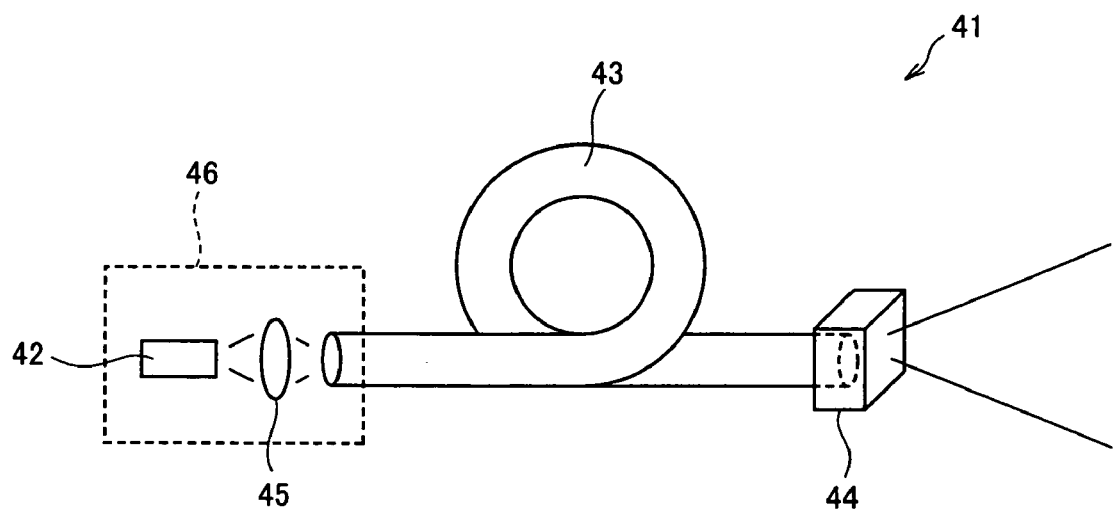
FIG. 12 is a diagram schematically showing a light emitting device 41 in a fourth preferable example of the present invention.

FIG. 12 is a diagram schematically showing a light emitting device 41 in a fourth preferable example of the present invention. Light emitting device 41 in the example shown in FIG. 12 includes a light emitting element 42, a light guide body 43 to which excitation light emitted from light emitting element 42 is optically coupled, and an optical part 44 at least made of a light transmitting resin having phosphors dispersed therein at a region other than the region where excitation light is optically coupled to light guide body 43.

In light emitting device 41 in the example shown in FIG. 12, a broad area-type semiconductor laser having a width of 10 μm which has an element structure as described above is preferably used as light emitting element 42. Excitation light from light emitting element 42 is applied into and optically coupled to light guide body 43 through an optical system including an aspheric lens 45. It is noted that light emitting element 42 and the optical system including aspheric lens 45 are normally stored in one module part 46 in order to become less susceptible to the external environment.

Light guide body 43 is not specifically limited as long as excitation light emitted from light emitting element 42 can optically be coupled thereto. Preferably, light guide body 43 is formed of an optical fiber structure in order to increase luminance (density of light intensity) at a light output end. Light guide body 43 in the example shown in FIG. 12 is realized, for example, by an S.I (step index) optical fiber made of a silica-based material having a core size of 1 mm. Excitation light from light emitting element 42 is arranged to enter one end of this optical fiber through the optical system so that the excitation light is optically coupled to the optical fiber that is light guide body 43.

Optical part 44 is arranged to be irradiated with the excitation light from optical element 42 through the other end of the optical fiber that is the above-noted light guide body 43. Four or more kinds that can realize the combination of emission peak wavelengths as described above can preferably be used as phosphors used in this optical part 44. The light transmitting resin having these phosphors dispersed therein may employ a conventionally known one as appropriate without any particular limitation.

According to light emitting device 41 having such a structure in the example shown in FIG. 12, a semiconductor laser which is easily optically coupled to an optical fiber is used as an excitation light source, and the excitation light gathers in the core size at the other end of the optical fiber where the phosphors are irradiated with the excitation light, thereby achieving fluorescence with high luminance.

Furthermore, in the configuration of phosphors in accordance with the present invention, the thermal energy caused by the Stokes loss produced in the phosphor portion is low, so that heat generation at this portion can be reduced even when the quantity of light of the excitation light source is increased and the luminance is increased. Thus, a light emitting device with high luminance characteristic can be provided.

In a phosphor having a luminescent center such as a transition metal activated with oxide or sulfide, so-called emission life for the emission intensity to attenuate to 1/e is relatively long in the order of a few microseconds to milliseconds. By contrast, in a phosphor using a semiconductor material, the emission life is as fast as a few nanoseconds, and excitation light having high light density which is applied to the phosphor can be emitted quickly as fluorescence, so that saturation of luminance is less likely to take place.

Figure 13:
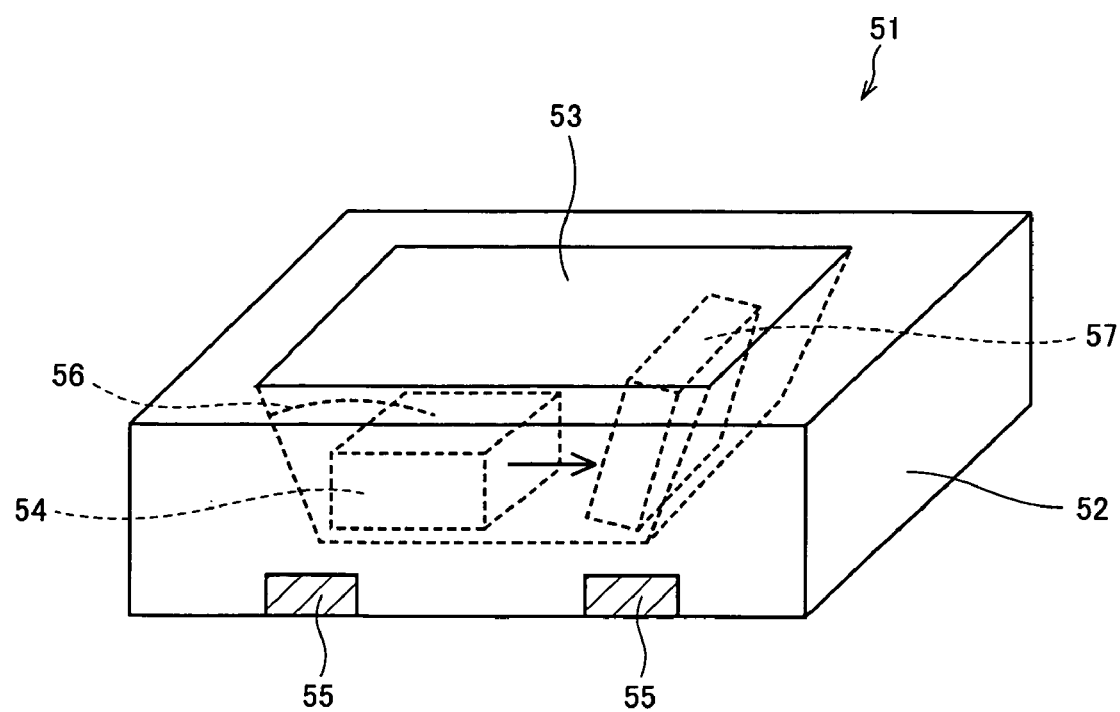
FIG. 13 is a diagram schematically showing a light emitting device 51 in a fifth preferable example of the present invention.

FIG. 13 is a diagram schematically showing a light emitting device 51 in a fifth preferable example of the present invention. In light emitting device 51 in the example shown in FIG. 13, similar to light emitting device 21 in the example shown in FIG. 10, a light emitting element 54 is mounted in a concave depression 53 of a ceramic material 52 having a thickness of about 5 mm, using silver paste. A gold wire 56 is provided from an electrode pad portion (not shown) of this light emitting element 54 to a power supply terminal 55 formed in a ceramic material 52 to be exposed outside, and this power supply terminal 55 supplies power. It is noted that light emitting device 51 shown in FIG. 13 differs from light emitting device 21 in the example shown in FIG. 10 in that a broad area-type semiconductor laser having a width of 10 μm which is similar to the one used in lightemitting device 41 shown in FIG. 12 is used as light emitting element 54.

Furthermore, in light emitting device 51 shown in FIG. 13, a light transmitting resin plate 57 having phosphors (not shown) dispersed therein is arranged in depression 53 of the above-noted ceramic material 52 such that it is irradiated with excitation light from optical element 54. Four or more kinds that can realize the combination of emission peak wavelengths as described above can also preferably be used as phosphors in light emitting device 51 in the example shown in FIG. 13. Furthermore, light transmitting resin plate 57 having these phosphors dispersed therein may employ a conventionally known one as appropriate without any particular limitation.

Because of the foregoing configuration, it is possible to realize a thin light emitting device having good luminous efficiency with respect to supply power. In addition, it is possible to realize a light emitting device having very good color rendering characteristic. Moreover, heat generation caused by the Stokes loss at the phosphor portion can be reduced, so that the radiation region of excitation light emitted from the semiconductor laser can be narrowed. Thus, the distance between the semiconductor laser and the transparent resin plate can be reduced or the transparent resin plate having phosphors dispersed therein can be reduced in size, thereby suitably reducing the size of the light emitting device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A light emitting device comprising:
a light emitting element having an emission peak wavelength of 350 nm-420 nm; and
a phosphor absorbing light from said light emitting element and emitting fluorescence having a different emission peak wavelength, said phosphor being formed of a semiconductor material that allows an emission peak wavelength to be controlled by transition across a bandgap and being configured with at least four fluorescences having different emission peak wavelengths,
wherein at least one of the emission peak wavelengths of said plurality of phosphors is selected in a range of 440 nm-480 nm, wherein at least one of the emission peak wavelengths of said plurality of phosphors is selected in a range of 500 nm-540 nm, wherein at least two of the emission peak wavelengths of said plurality of phosphors are selected in a range of 540 nm-560 nm and a range of 600 nm-680 nm, or a range of 570 nm-610 nm and a range of 610 nm-650 nm.

2. The light emitting device according to claim 1, wherein said phosphor is formed of a nano-size particle that produces a quantum effect, and an emission peak wavelength is controlled by transition across a quantum level formed by this effect.

3. The light emitting device according to claim 1, wherein said light emitting element is a light emitting diode or a semiconductor laser including nitride semiconductor.

4. The light emitting device according to claim 1, wherein the emission peak wavelengths of said plurality of phosphors are selected in a range of 430 nm-760 nm.

5. The light emitting device according to claim 4, wherein the emission peak wavelengths of said plurality of phosphors are arranged at approximately regular intervals.

6. The light emitting device according to claim 1, comprising:

a lead frame having said light emitting element mounted thereon;

a wire electrically connecting said light emitting element and a power supply portion provided in said lead frame to each other; and a phosphor dispersed in a light transmitting resin and irradiated with excitation light emitted from said light emitting element.

7. The light emitting device according to claim 6, wherein said light emitting element is covered with said light transmitting resin.

8. The light emitting device according to claim 7, further comprising an optical part formed of a light transmitting resin which can control a light radiation state in which fluorescence emitted from the phosphor dispersed in said light transmitting resin is emitted in a space.

9. The light emitting device according to claim 1, comprising:

a light guide body to which excitation light emitted from said light emitting element is optically coupled; and an optical part at least formed of a light transmitting resin having said phosphor dispersed therein at a region other than a region where excitation light is optically coupled to said light guide body.

10. The light emitting device according to claim 9, wherein said light guide body is formed of an optical fiber structure.

* * * * *